United States Patent [19]

Yokoyama

[11] 4,454,478
[45] Jun. 12, 1984

[54] GAIN-CONTROLLED AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 387,753

[22] Filed: Jun. 11, 1982

[30] Foreign Application Priority Data

Jun. 19, 1981 [JP] Japan .................................. 56-90166
Jun. 19, 1981 [JP] Japan .................................. 56-90167
Jun. 19, 1981 [JP] Japan .................................. 56-95110

[51] Int. Cl.³ .............................................. H03G 3/10
[52] U.S. Cl. .................................... 330/254; 330/260; 330/293
[58] Field of Search ................ 330/254, 260, 278, 293

[56] References Cited

U.S. PATENT DOCUMENTS

3,908,172 9/1975 Aschermann et al. .............. 330/254

Primary Examiner—James B. Mullins
Assistant Examiner—Steven J. Mottola
Attorney, Agent, or Firm—Cushman, Darby & Cushman

[57] ABSTRACT

A gain-controlled amplifier comprises input signal amplifying means; first and second bipolar transistor pairs each having a joined emitter connected to each other and driven by an output of the input signal amplifying means, bases of one transistors of said transistor pairs being commonly connected, and bases of the other transistors of said transistor pairs being commonly connected; and addition means for adding a signal representing a difference between collector currents of said the one transistor of the first transistor pair and said the other transistor of the second transistor pair to a signal representing a difference between collector currents of said the other transistor of the first transistor pair and said the one transistor of the second transistor pair, wherein a control voltage is applied between said two common-connected bases; an output of said addition means is negative-fed back to an input side of said input signal amplifying means; and either one of said signals to be added by said addition means is derived as an output of said gain-controlled amplifier. Furthermore the gain-controlled amplifier of the present invention may preferably be provided with a control voltage symmetrical with respect to ground and with a compensating circuit for a difference between transistor characteristics of opposite conductivity types.

11 Claims, 9 Drawing Figures

GAIN-CONTROLLED AMPLIFIER

BACKGROUND OF THE INVENTION

1. Field of the Invention

The present invention relates to a gain-controlled amplifier the gain of which varies exponentially in response to a linear voltage variation of a control voltage applied to the amplifier, to operate with reduced distortion.

2. Description of the Prior Art

Figure 1:
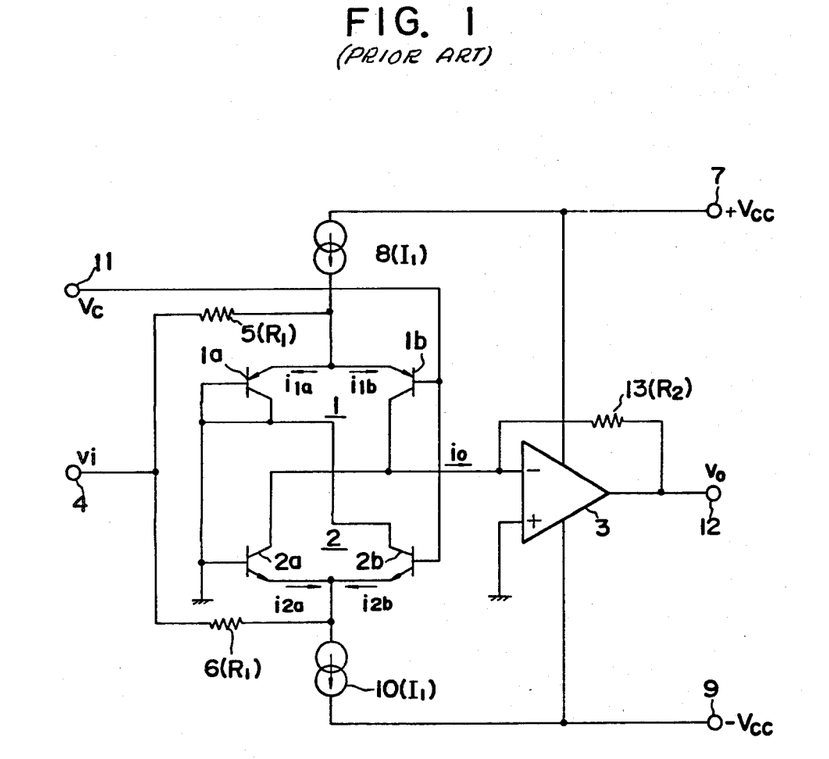
FIG. 1 is a schematic circuit diagram of a prior art typical gain-controlled amplifier.

One typical circuit arrangement of conventional gain-controlled amplifiers is shown in FIG. 1, wherein the gain-controlled amplifier comprises: a first pair of bipolar transistors $1a$ and $1b$ (PNP type), a second pair of bipolar transistors $2a$ and $2b$ (NPN type), and an operational amplifier 3. The first pair of bipolar transistors $1a$ and $1b$ and the second pair of bipolar transistors $2a$ and $2b$ are designated by reference numerals 1 and 2, respectively. The emitters of transistors $1a$ and $1b$ are connected together to form a first common emitter, while the emitters of transistors $2a$ and $2b$ are also connected together to form a second common emitter. An input signal vi applied to an input signal terminal 4 is fed through respective resistors 5 and 6 having the same value of $R_1$ to the respective first and second common emitters. A control voltage Vc from a control input terminal 11 is supplied to the bases of the transistors $1b$ and $2b$, while the bases of the transistors $1a$ and $2a$ are connected to ground. Constant current sources 8 and 10 supplies constant currents $I_1$ and $I_2$ to the first and second common emitters from power supply terminals 7(+Vcc) and 9(−Vcc), respectively. The collectors of the transistors $1a$ and $2b$ are coupled together and connected to ground, and the collectors of the transistors $1b$ and $2a$ are connected to an inverting input terminal of the operational amplifier 3, the non-inverting input terminal thereof being grounded. A feedback resistor 13 having a value of $R_2$ is connected between the inverting input terminal and the output terminal of the operational amplifier 3. In this circuit, at a signal output terminal 12 is derived an output voltage $V_0$ converted from a current $i_0$ which is derived from the connection point of the collectors of the transistors $1b$ and $2a$.

In the conventional gain-controlled amplifier with such a circuit configuration, the following relation is recognized between each emitter current $i_1a$, $i_1b$, $i_2a$ and $i_2b$ of the respective transistors $1a$, $1b$, $2a$ and $2b$ and the control voltage Vc, when the characteristics of the PN junction of the transistor are taken into account.

$$\left. \begin{array}{l} i_1b = i_1a \cdot \exp(-K \cdot Vc) \\ i_2a = i_2b \cdot \exp(-K \cdot Vc) \end{array} \right\} \quad (1)$$

where $K = q/kT$, k represents a Boltzmann's constant, q represents an electric charge, and t represents a junction temperature. Assuming that the voltage vi of the input signal applied to the input terminal 4 is greater than each base-emitter voltage of the transistors $1a$, $1b$, $2a$ and $2b$, then the following equation may be derived.

$$\left. \begin{array}{l} i_1a + i_1b = I_1 + vi/R_1 \\ i_2a + i_2b = I_1 - vi/R_1 \end{array} \right\} \quad (2)$$

By combining the two above equations (1) and (2) together, $i_1b$ and $i_2a$ are given by $$\left. \begin{array}{l} i_1b = \dfrac{I_1 + \dfrac{vi}{R_1}}{\exp(K \cdot Vc) + 1} \\ i_2a = \dfrac{I_1 - \dfrac{vi}{R_1}}{\exp(K \cdot Vc) + 1} \end{array} \right\} \quad (3)$$

The current $i_0$ which is derived from either the transistor $1b$ or the transistor $2a$ and thereafter delivered to the operational amplifier 3 may be expressed by $$i_0 = i_1b - i_2a \quad (4)$$

By substituting the equation (3) into the equation (4), then $$i_0 = \dfrac{2vi}{R_1 \{\exp(K \cdot Vc) + 1\}} \quad (5)$$

The output voltage $v_0$ appearing at the signal output terminal 12 may be expressed as $$v_0 = -i_0 \cdot R_2 \quad (6)$$

By substituting the equation (5) into the equation (6) above, then $$v_0 = \dfrac{-2vi \cdot R_2}{R_1 \{\exp(K \cdot Vc) + 1\}} \quad (7)$$

Therefore, the voltage gain Av of the gain-controlled amplifier shown in FIG. 1 is expressed by the following equation.

$$Av = \dfrac{-2R_2}{R_1 \{\exp(K \cdot Vc) + 1\}} \quad (8)$$

From the above equation (8), it is understood that the voltage gain Av varies exponentially with the control voltage Vc, provided that the value of exp (K·Vc) in the divisor is larger than 1, that is, the control voltage Vc is larger than 0.

Such a gain-controlled amplifier as shown in FIG. 1 has been found, however, not entirely satisfactory. Disadvantages accompanied by such a gain-controlled amplifier as shown in FIG. 1 are that (1) since the gain-controlled amplifier is essentially so implemented as to change its gain, overall negative feedback can not be applied to the gain-controlled amplifier. Therefore, conventional gain-controlled amplifiers without negative feedback have a relatively high distortion factor, (2) the operation of the two pairs of the transistors is asymmetrical to each other, i.e., the operation differs depending upon whether the input signal vi is positive or negative. This is understood from the fact that the currents $i_1b$ and $i_2a$ which constitute the current $i_0$ are determined differently, that is, the current $i_1b$ depends on the PNP type first transistor pair 1, while the current $i_2a$ depends on the NPN type second transistor pair 2. According to the polarities of the input signal, as seen from the equation (3), the amount of the currents $i_1b$ and $i_2a$ varies. Thus, the asymmetrical operation of the gain-controlled amplifier results in a high distortion with even order harmonics, and (3) the disadvantage described in the above (2) is also caused by an asymmetrical control voltage Vc which is defined by a voltage difference between two common-connected bases, to one common-connected bases of which a potential is applied with respect to ground. In this case, since the transistors are used with a low collector-emitter voltage in view of exponential characteristics, the gain of the respective transistors varies to a large extent and hence the effects of the asymmetrical control voltage Vc is enhanced.

SUMMARY OF THE INVENTION

It is, therefore, a principal object of the present invention to provide a novel gain-controlled amplifier whose gain varies exponentially in response to the linear level variation of a control voltage applied thereto, and to which a negative feedback can be applied.

It is still another object of the invention to provide the gain-controlled amplifier in which a symmetrical operation with regard to signal polarities is attained by compensating the difference between opposite transistor conductivities, thereby resulting in a low distortion with lesser even order harmonics.

It is a further object of the present invention to provide the gain-controlled amplifier in which the control voltage is applied symmetrically with respect to ground thereby enhancing the distortion reduction effects.

The gain-controlled amplifier of this invention comprises input signal amplifying means; first and second bipolar transistor pairs each having a joined emitter connected to each other and driven by an output of the input signal amplifying means, bases of one transistors of said transistor pairs being commonly connected, and bases of the other transistors of said transistor pairs being commonly connected; and addition means for adding a signal representing a difference between collector currents of said the one transistor of the first transistor pair and said the other transistor of the second transistor pair to a signal representing a difference between collector currents of said the other transistor of the first transistor pair and said the one transistor of the second transistor pair; wherein a control voltage is applied between said two common-connected bases; an output of said addition means is negative-fed back to an input side of said input signal amplifying means; and either one of said signals to be added by said addition means is derived as an output of said gain-controlled amplifier.

The foregoing and other objects, the features and the advantages of the present invention will be pointed out in, or apparent from, the following description of the preferred embodiments considered together with the accompanying drawings.

DETAILED DESCRIPTION OF THE PREFERRED EMBODIMENTS

Figure 2:
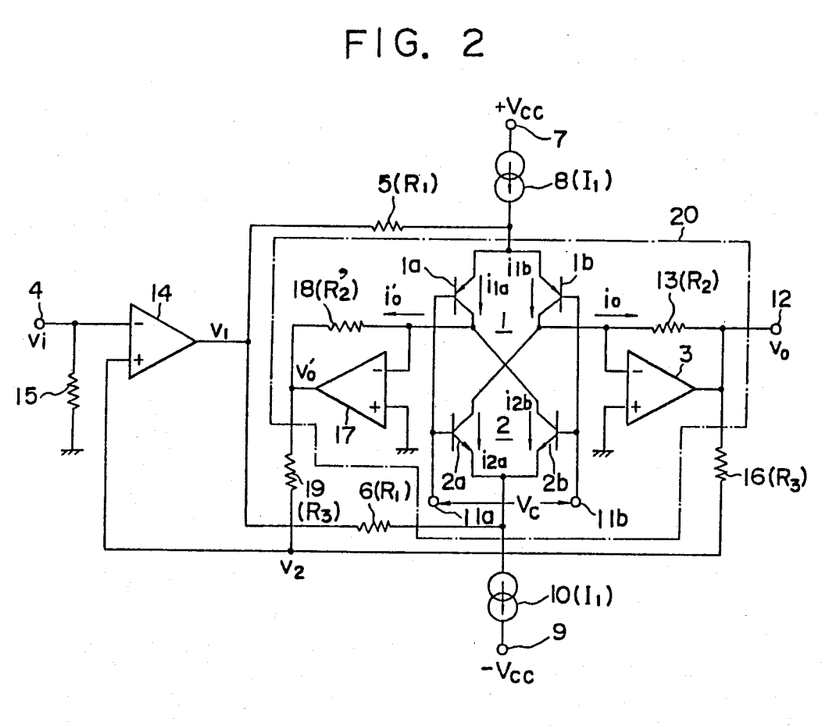
FIG. 2 is a schematic circuit diagram of a first embodiment of the gain-controlled amplifier according to the present invention.

FIG. 2 shows a circuit diagram of a first embodiment of the invention, wherein identical reference numerals have been used to designate corresponding parts of FIG. 1. In FIG. 2, an input signal having a voltage value vi is amplified by an operational amplifier 14 having an inverting input terminal connected to an input signal terminal 4 and to ground through a resistor 15, and having an output terminal connected through a resistor 5 (resistance value $R_1$) to joined emitters of a first bipolar transistor pair 1, and also through a resistor 6 (resistance value $R_1$) to joined emitters of a second bipolar transistor pair 2. The first bipolar transistor pair 1 is comprised of two PNP type transistors 1a and 1b, and the second bipolar transistor pair 2 is comprised of two NPN type transistors 2a and 2b. The bases of the transistors 1a and 2a, and those of the transistors 1b and 2b, are respectively connected to control voltage input terminals 11a and 11b, and between those terminals 11a and 11b a control voltage Vc is applied. The operational amplifier 14 has a non-inverting terminal connected through a resistor 16 (resistance value $R_3$) to an output terminal of an operational amplifier 3.

Another operational amplifier 17 is provided for converting a current $i_0'$ which is derived from either the collector of the transistor 1a or that of the transistor 2b into a voltage $v_0'$. The operational amplifier 17 has an inverting input terminal connected to the collector of the transistor 1a and to an output terminal thereof through a resistor 18 (resistance value $R_2'$), a non-inverting input terminal being grounded and the output terminal being connected to the non-inverting terminal of the operational amplifier 14 through a resistor 19 (resistance value $R_3'$).

The operational amplifier 3 has an inverting input terminal connected to the collector of the transistor 1b and to the output terminal thereof through a resistor 13 (resistance value $R_2$), a non-inverting input terminal being grounded. The amplifier 3 converts a current io which is derived from either one of the collectors of the transistors 1b and 2a. An output signal having a voltage value $v_0$ is derived at an output signal terminal 12 from the output terminal of the operational amplifier 3.

The above-mentioned resistors 16 and 19 functions as addition means by which the output voltages $v_0$ and $v_0'$ of the operational amplifier 16 and 19 are added together to each other and then fed back to the non-inverting input terminal of the operational amplifier 14.

With such a circuit configuration, the currents $i_1a$, $i_1b$, $i_2a$ and $i_2b$ are related to the control voltage Vc by the foregoing equation (1), and the following equation may hold with respect to an output voltage $v_1$ of the operational amplifier 14.

$$i_1a + i_1b = I_1 + \frac{v_1}{R_1}$$
$$i_2a + i_2b = I_1 - \frac{v_1}{R_1} \quad (9)$$

Combining the equation (9) with the equation (1), the result is $$i_1b = \frac{I_1 + \frac{v_1}{R_1}}{\exp(K \cdot V_c) + 1}$$
$$i_2a = \frac{I_1 - \frac{v_1}{R_1}}{\exp(K \cdot V_c) + 1} \quad (10)$$

Using this equation (10) and the equation (4), the current $i_0$ is expressed as $$i_0 = \frac{2v_1}{R_1 \{\exp(K \cdot V_c) + 1\}} \quad (11)$$

Then, the voltage $v_0$ of the output signal appearing at the terminal 12 is $$v_0 = -i_0 \cdot R_2 \quad (12)$$
$$= \frac{-2v_1 \cdot R_2}{R_1 \{\exp(K \cdot V_c) + 1\}}$$

From the equation (12), the voltage gain Av, obtained between the output voltage vi of the operational amplifier 14 and the output voltage $v_0$ appearing at the output signal. terminal 12, is expressed as $$A_v = \frac{v_0}{v_1} = \frac{-2R_2}{R_1 \{\exp(K \cdot V_c) + 1\}} \quad (13)$$

The current $i_0'$ is also expressed as $$i_0' = i_1a - i_2b \quad (14)$$

Then, the following equation may be hold by using the equations (9) and (10).

$$i'_0 = \frac{2v_1}{R_1 \{\exp(-K \cdot V_c) + 1\}} \quad (15)$$

The output voltage $v_0'$ of the operational amplifier 17 is therefore $$v'_0 = -i'_0 \cdot R'_2 \quad (16)$$
$$= \frac{-2v_1 \cdot R'_2}{R_1 \{\exp(-K \cdot V_c) + 1\}}$$

Assuming that the resistance value $R_2$ is equal to the resistance value $R_2'$, then the voltage $v_0'$ is expressed as $$v'_0 = \frac{-2v_1 \cdot R_2}{R_1 \{\exp(-K \cdot V_c) + 1\}} \quad (17)$$

Also assuming that the resistance value $R_3$ is equal to the resistance value $R_3'$, then a voltage $v_2$ appearing at the non-inverting input terminal of the operational amplifier 14 is $$v_2 = \frac{v_0 + v'_0}{2} \quad (18)$$

Substituting the equations (12) and (17) into the above equation (18), the result is $$v_2 = \frac{-2v_1 \cdot R_2}{2R_1} \left( \frac{1}{\exp(K \cdot V_c) + 1} + \frac{1}{\exp(-K \cdot V_c) + 1} \right) \quad (19)$$

$$= \frac{-v_1 \cdot R_2}{R_1} \left[ \frac{\exp(-K \cdot V_c) + 1 + \exp(K \cdot V_c) + 1}{\{\exp(K \cdot V_c) + 1\}\{\exp(-K \cdot V_c) + 1\}} \right]$$

$$= \frac{-v_1 \cdot R_2}{R_1} \left[ \frac{\exp(-K \cdot V_c) + 1 + \exp(K \cdot V_c) + 1}{1 + \exp(K \cdot V_c) + \exp(-K \cdot V_c) + 1} \right]$$

$$= \frac{-R_2}{R_1} \cdot v_1$$

As seen from the above, under an ideal operation where distortion is not taken into consideration, the voltage $v_2$ obtained by summing the voltages $v_0$ and $v_0'$ is proportionate to the voltage $v_2$ irrespective of the value of the control voltage Vc. Consequently, the voltage $v_2$ can be used as a feedback signal.

Next, circuit operation of the first embodiment is described taking a distortion development into consideration. the voltage gain Ad, obtained between the input voltage vi of the operational amplifier 14 and the output voltage $v_0$ appearing at the output signal terminal 12, may presumably be expressed in the following equation.

$$A_d = (1+d) A_v \quad (20)$$

where d denotes a distortion factor. Therefore, the voltage gain Ad, i.e., $v_0/v_I$ is given by $$\frac{v_0}{v_1} = (1 + d) \frac{-2R_2}{R_1 \{\exp(K \cdot V_c) + 1\}} \quad (21)$$

Similar to the above, representing the current $i_0$ as $i_0d$ considering the distortion development, the current $i_0d$ may be expressed as $$i_0d = (1 + d) \frac{2v_1}{R_1 \{\exp(K \cdot V_c) + 1\}} \quad (22)$$

In the first embodiment, the circuit for generating the current $i_0$ and converting it to the voltage $v_0$, and the circuit for generating the current $i_0'$ and converting it to the voltage $v_0'$ are implemented symmetrically to one another. As a result, representing the current $i_0'$ as $i_0'd$ considering the distortion development, the current $i_0'd$ may be expressed as $$i'_0d = (1 + d) \frac{2R_2}{R_1 \{\exp(-K \cdot V_c) + 1\}} \quad (23)$$

Then, the voltage $v_2$ becomes $$v_2 = -\frac{(1+d)\cdot R_2 \cdot v_1}{R_1}\left(\frac{1}{\exp(K\cdot Vc)+1} + \frac{1}{\exp(-K\cdot Vc)+1}\right) \quad (24)$$

$$= -\frac{(1+d)\cdot R_2}{R_1}v_1$$

From the equations (24) and (21), the voltage $v_0$ is $$v_0 = \frac{-2(1+d)\cdot R_2}{R_1\{\exp(K\cdot Vc)+1\}} \times \frac{-R_1 \cdot v_2}{(1+d)\cdot R_2} \quad (25)$$

$$= \frac{2v_2}{\exp(K\cdot Vc)+1}$$

The equation (25) indicates that no distortion develops in the relation between the voltage $v_2$ and the voltage $v_0$.

Since the voltages $v_2$ and $v_1$ are opposite in phase as seen from the equation (19), a negative feed back loop is formed along the path through which the voltage $v_2$ is fed back to the non-inverting input terminal of the operational amplifier 14. In this case, if the operational amplifier 14 itself has a sufficient gain, the negative feedback loop operates to make the voltage $v_2$ (a negative feedback signal voltage) equal to the voltage $v_i$ of the input signal, and the gain-controlled amplifier as a whole finally reaches a stable condition of ($v_2 = v_i$).

Thus, the equation (25) can be rewritten in the following $$v_0 = \frac{2v_i}{\exp(K\cdot Vc)+1} \quad (26)$$

and the overall voltage gain A in this embodiment circuit is $$A = \frac{v_0}{v_i} = \frac{2}{\exp(K\cdot Vc)+1} \quad (27)$$

As understood from the equation (27), it is appreciated that the voltage $v_0$ of the output signal contains no distortion, and the overall voltage gain A may be varied exponentially in response to the linear voltage variation of the control voltage Vc.

Next, modified embodiments of the above first embodiment will be described in which a negative feedback signal is generated by a different circuit arrangement from that of the first embodiment.

Figure 3:
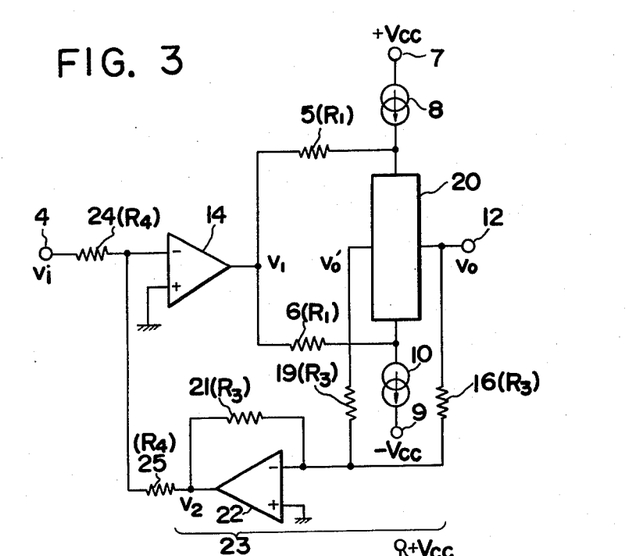
FIG. 3 is a schematic circuit diagram of a first modification of the first embodiment wherein a first modified addition circuit is employed.

FIG. 3 shows a circuit diagram of a first modification of the first embodiment. In FIG. 3, a reference numeral 20 designates the circuit encircled by a one-dot-chain line 20 in FIG. 2. An addition circuit 23 for adding the voltages $v_0$ and $v_0'$ is comprised of summing resistors 16 and 19 (resistance value $R_3$), an operational amplifier 22, and a feedback resistor 21 (resistance value $R_3$) for the amplifier 22. In this circuit, an input signal having a voltage value of vi and applied to an input signal terminal 4 is supplied through a resistor 24 (resistance value $R_4$) to an inverting input terminal of an operational amplifier 14, to which inverting input terminal an output having a voltage value of $v_2$ of the addition circuit 23 is negatively fed back through a resistor 25 (resistance value $R_4$).

Figure 4:
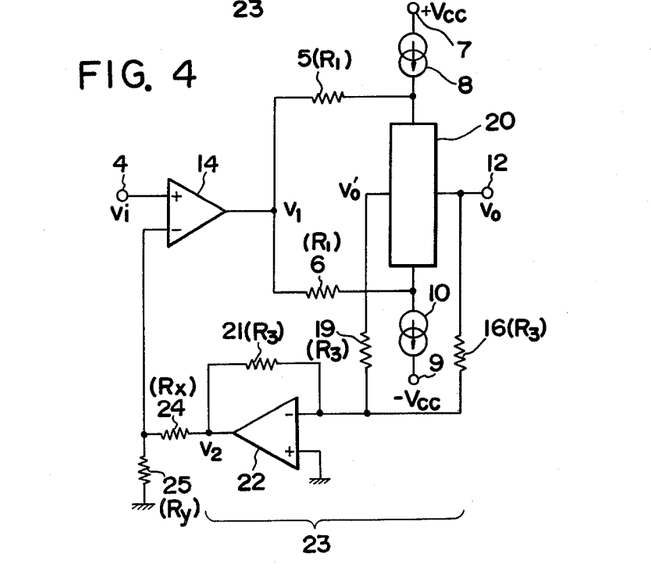
FIG. 4 is a schematic circuit diagram of a second modification of the first embodiment wherein a second modified addition circuit is employed.

FIG. 4 shows a circuit diagram of a second modification of the first embodiment. The second modification differs from the first one in that an input signal having a voltage value vi is supplied to a non-inverting input terminal of an operational amplifier 14, and an output of an addition circuit 23 having a voltage value of $v_2$ is divided by resistors 24 and 25 (respective resistance values Rx and Ry) and then supplied to an inverting input terminal of the operational amplifier 14 as a feedback signal. In this modification, the input signal vi and the output signal $v_0$ are opposite in phase.

Figure 5:
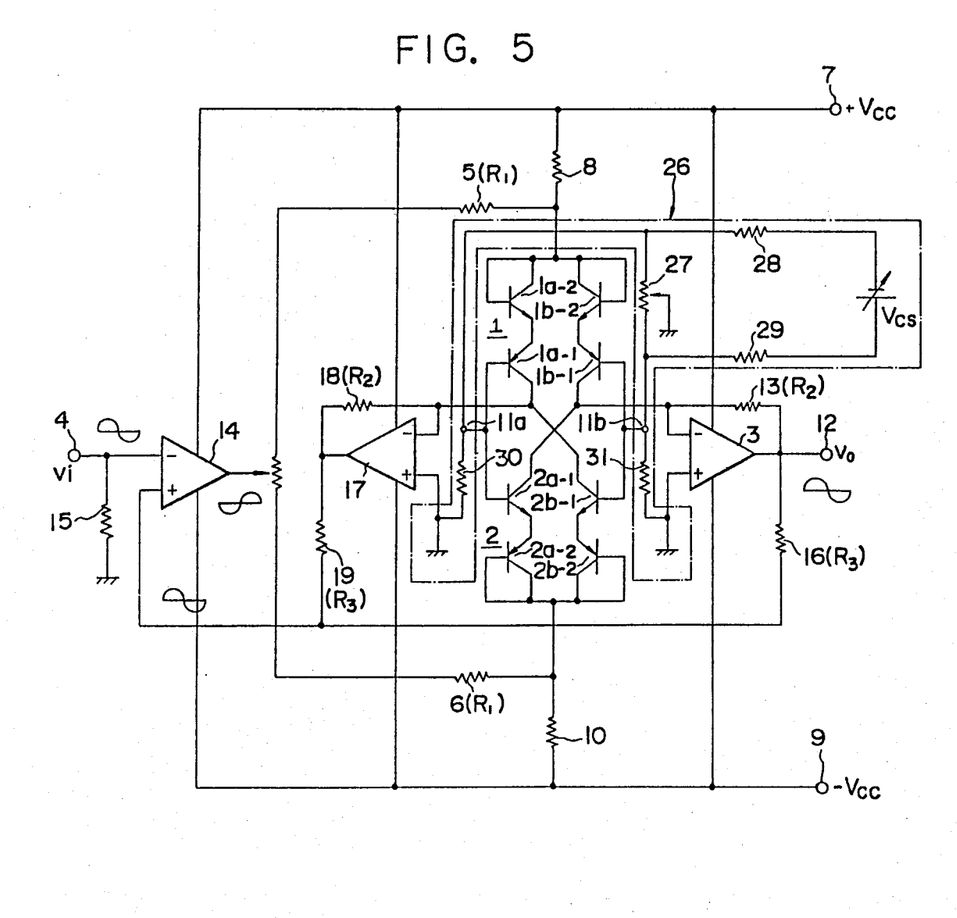
FIG. 5 is a schematic circuit diagram of a second embodiment in which asymmetrical operation of the first embodiment is eliminated by the provision of a control voltage symmetrical with respect to ground and by the provision of compensating means for a difference between transistor characteristics of opposite conductivities.

FIG. 5 shows a circuit diagram of a second embodiment in which opposite conductivity type transistors are added to each of the two pairs of transistors of the first embodiment for cancelling out the imbalance of exponential characteristics of the transistor pairs so as to reduce a second harmonic distortion, and a symmetrical control voltage to ground is employed for further decreasing even order harmonics. To this end, in the second embodiment, transistors 1a-2, 1b-2, 2a-2 and 2b-2 are employed for cancelling out the imbalance of opposite conductivity transistors 1a-1, 1b-1, 2a-1 and 2b-1. In addition to the above, a variable resistor 27 with a sliding tap grounded is provided for supplying symmetrical control voltage with respect to ground to the bases of the transistors 1a-1, 1b-1, 2a-1 and 2b-1. Similar reference numerals have been used to designate corresponding parts of FIG. 2.

The transistor 1a-2 (NPN type) having an opposite conductivity to that of the transistor 1a-1 (PNP type) is connected between the emitter of the transistor 1a-1 and the resistor 8, with the base and collector of the transistor 1a-2 being coupled or shorted together, that is, diode-connected. The emitter of the transistor 1a-2 is connected to the emitter of the transistor 1a-1, while the collector is connected to the resistor 8. In other words, the transistors 1a-1 and 1a-2 are so connected to allow the current flowing through the transistors 1a-2 and 1a-1 to conduct in the same forward direction. The transistor 1b-2 (NPN type) having an opposite conductivity to that of the transistor 1b-1 (PNP type) is connected between the emitter of the transistor 1b-1 and the resistor 8, with the base and collector of the transistor 1b-2 being coupled or shorted together. The emitters of the transistors 1b-1 and 1b-2 are connected together, while the collector of the transistor 1b-2 is connected to the resistor 8. Similarly to the above circuit configuration, the transistors 2a-1 and 2a-2 (PNP type) are connected between the resistor 10 and the respective transistors 2a-1 and 2b-1 (NPN type), with the base and collector of the respective transistors 2a-2 and 2b-2 being coupled or shorted together. The emitters of the transistors 2a-2 and 2b-2 are connected to the respective emitters of the transistors 2a-1 and 2b-1, while the collectors of the transistors 2a-2 and 2b-2 are connected to the resistor 10.

With such a circuit configuration, the following equations hold:

$$\left.\begin{array}{l} V_{BE1a}=V_{BEN1a}+V_{BEP1a} \\ V_{BE1b}=V_{BEN1b}+V_{BEP1b} \\ V_{BE2a}=V_{BEN2a}+V_{BEP2a} \\ V_{BE2b}=V_{BEN2b}+V_{BEP2b} \end{array}\right\} \quad (28)$$

where $V_{BE1a}$ is the voltage between the base of the transistor 1a-1 and the collector of the transistor 1a-2, $V_{BE1b}$ is the voltage between the base of the transistor 1b-1 and the collector of the transistor 1b-2, $V_{BE2a}$ is the voltage between the base of the transistor 2a-1 and the collector of the transistor 2a-2, $V_{BE2b}$ is the voltage between the base of the transistor 2b-1 and the collector of the transistor 2b-2, $V_{BEN1a}$ and $V_{BEP1a}$ are the base-emitter voltages of the respective transistors 1a-1 and 1a-2.

$V_{BEN1b}$ and $V_{BEP1b}$ are the base-emitter voltages of the respective transistors 1b-1 and 1b-2, $V_{BEN2a}$ and $V_{BEP2a}$ are the base-emitter voltages of the respective transistors 2a-1 and 2a-2, and $V_{BEN2b}$ and $V_{BEP2b}$ are the base-emitter voltages of the respective transistors 2b-1 and 2b-2.

In addition to the above equation (28), it is possible in practical use to consider that the $V_{BE}$—Ic characteristics of the same conductivity type bipolar transistors are substantially the same to each other. As a result, the base-emitter voltages $V_{BE2a}$ and $V_{BE2b}$ for a positive input signal are equal to the base-emitter voltages $V_{BE1b}$ and $V_{BE1a}$ for a negative input signal, respectively. Thus, according to this second embodiment of the invention, both positive and negative input signals are amplified symmetrically with same gains, each of which gain is varied exponentially in accordance with the control voltage Vc.

Furthermore the second embodiment employs symmetrical control voltages with respect to ground. In FIG. 5, a control voltage supply circuit 26 shown as encircled by a one-dot-chain line is provided for supplying control input terminals 11a and 11b with symmetrical control voltages with respect to ground. The control voltage supply circuit 26 is comprised of a control voltage source having a voltage value of Vcs, the variable resistor 27 and four resistors 28 through 31. The control voltage Vcs is supplied between the control voltage input terminals 11a and 11b through resistors 28 and 29, and hence between the common bases of the transistors 1a-1 and 2a-1 and those of the transistors 1b-1 and 2b-1. Between both control voltage input terminals 11a and 11b, the variable resistor 27 with the slider tap grounded is connected, and both terminals are also grounded through respective resistors 30 and 31. With such a circuit configuration for the control voltage supply circuit 26, symmetrical control voltages having voltage values ±Vc with respect to ground can be generated, thereby decreasing even order harmonics in the gain-controlled amplifier.

Some modified control voltage circuits can be embodied other than the above circuit arrangement. Such modified control voltage circuits are shown in FIGS. 6 through 8, wherein similar circuit elements are designated by identical reference numerals.

Figure 6:
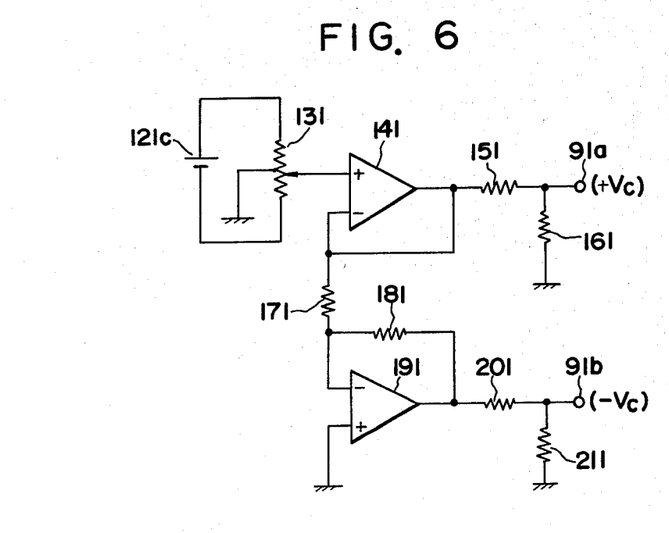
FIGS. 6 through 8 are schematic circuit diagrams respectively illustrating modified control voltage supply circuits.

FIG. 6 shows a circuit diagram of a first modification of the control voltage supply circuit 26 shown in FIG. 5. As is readily seen from the circuit diagram, a control voltage source 121c is connected across both end terminals of a variable resistor 131 whose electrical middle point is grounded. Out of a slider tap of the variable resistor 131, a voltage is derived which is applied to an operational amplifier 141 with a gain of 1 to obtain at a terminal 91a a positive control voltage +Vc through a voltage divider comprised of resistors 151 and 161. The output of the operational amplifier 141 is also applied to an operational amplifier 191 with a gain of −1 through a resistor 171 to obtain at a terminal 91b a negative control voltage −Vc through a voltage divider comprised of resistors 201 and 211. Reference numeral 181 designates a feedback resistor of the operational amplifier 191.

Figure 7:
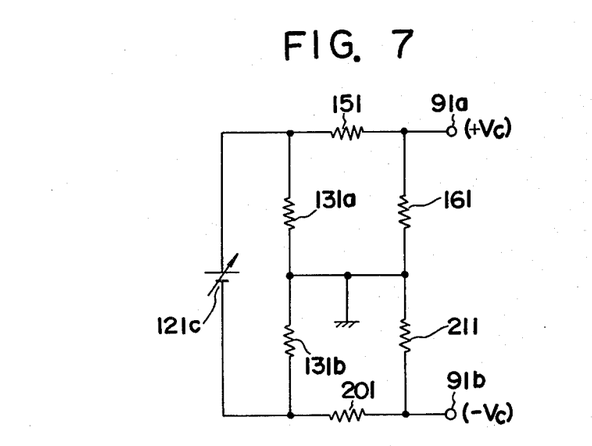

FIG. 7 shows a circuit diagram of a second modification of the control voltage supply circuit. A variable direct-current control voltage source 121c is connected across serially connected resistors 131a and 131b of the same resistance value whose connection point is grounded. The resultant positive and negative voltages symmetrical to ground are respectively supplied to a voltage divider comprised of resistors 151 and 161 to generate a positive control voltage +Vc at a terminal 91a, and to voltage divider comprised of serially connected resistors 201 and 211 to generate a negative control voltage −Vc at a terminal 91b.

Figure 8:
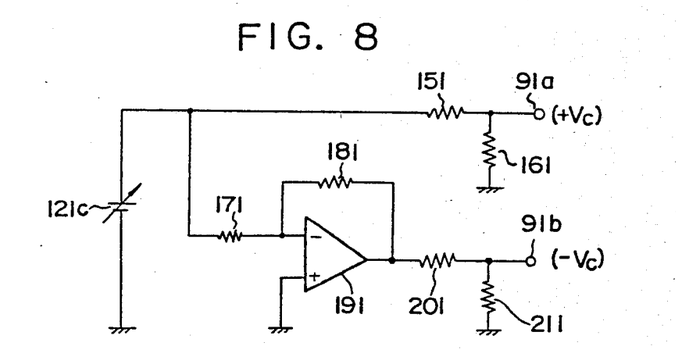

FIG. 8 shows a circuit diagram of a third modification of the control voltage supply circuit. A variable direct-current control voltage source 121c is grounded at one end thereof, and a voltage supplied from the other end thereof is applied to a voltage divider comprised of serially connected resistors 151 and 161 to obtain at a terminal 91a a positive control voltage +Vc, and is applied to an operational amplifier 191 having a gain of −1 through a resistor 171 to obtain at a terminal 91b a negative control voltage −Vc through a voltage divider comprised of serially connected resistors 201 and 211. Reference numeral 181 designates a feedback resistor for the operational amplifier 191.

With the above three circuit arrangement modifications for the control voltage supply circuit, symmetrical control voltages having voltage value ±Vc with respect to ground can be generated, thereby decreasing even order harmonics when applied to the gain control amplifier.

Figure 9:
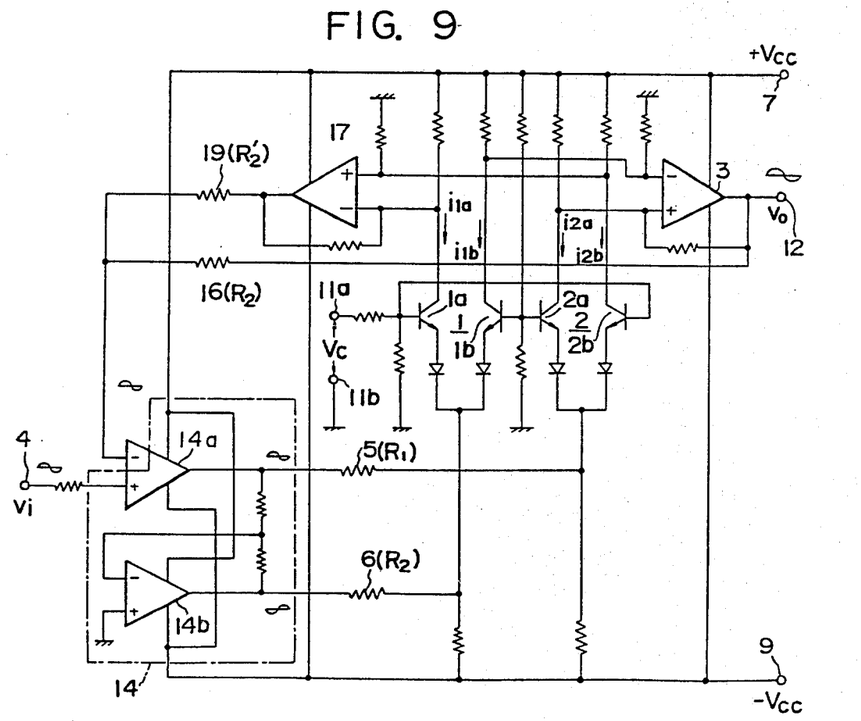
FIG. 9 is a schematic circuit diagram of a third embodiment of the gain-controlled amplifier according to the present invention.

FIG. 9 shows a circuit diagram of a third embodiment in which the bipolar transistor pairs 1 and 2 used in the first and second embodiments are replaced by same conductivity type transistors 1a, 1b, 2a and 2b all of an NPN type in this embodiment. By virtue of the same conductivity type transistors, symmetrical operation is assured to decrease even order harmonics at the output of the gain-controlled amplifier. In the gain-controlled amplifier according to the third embodiment, an input signal vi applied to a signal input terminal 4 is fed to an input amplifier section 14 comprised of operational amplifiers 14a and 14b, and the input amplifier section 14 generates two signals having the same amplitude and opposite polarities. The two signals are in turn applied through respective resistors 5 and 6 to the joined emitters of the bipolar transistor pairs 2 and 1 which change the gain of the gain-controlled amplifier exponentially in accordance with the control voltage Vc applied between control input terminals 11a and 11b. With the transistor pairs 1 and 2, the operation of the collector currents $i_1a$, $i_1b$, $i_2a$, and $i_2b$ is performed by two operational amplifiers 3 and 17 the outputs of which are applied through respective resistors 19 and 16 to an inverting input terminal of the operational amplifier 14a. Thus, the outputs of the operational amplifiers 3 and 17 are added to each other and used for a negative feedback signal of the gain-controlled amplifier.

While there has been shown and described specific embodiments of the present invention, it will be obvious to those skilled in the art that various changes and modification may be made without departing from the invention in its broader aspects; and, therefore, it is intended that the appended claims cover all such changes and modifications as fall within the true spirit and scope of the invention.

What is claimed is:

1. A gain-controlled amplifier whose gain is controlled by a control voltage applied thereto comprising:
   an input signal terminal for receiving an input signal;
   input signal amplifying means coupled to said input signal terminal for amplifying said input signal applied to said input signal terminal;
   first bipolar transistor pair having first and second transistors of same conductivity types each transistor having a base, an emitter, and a collector, both emitters being joined together to form a first joined emitter and driven by an output of said input signal amplifying means;
   second bipolar transistor pair having third and fourth transistors of same conductivity types each transistor having a base, an emitter, and a collector, both emitters being joined together to form a second joined emitter and driven by an output of said input signal amplifying means;
   first generating means for generating a first signal representing a current difference between collector currents of said first and fourth transistors;
   second generating means for generating a second signal representing a current difference between collector currents of said second and third transistors;
   addition means for adding output signals of said first and second generating means;
   negative feedback circuit means for negative-feeding back an output of said addition means to an input side of said input signal amplifying means; and
   an output signal terminal coupled to derive one of the output signals of said first and second generating means therefrom as an output signal of said gain-controlled amplifier;
   said bases of said first and third transistors being joined together to form a first control voltage input terminal;
   said bases of said second and fourth transistors being joined together to form a second control voltage input terminal; and
   said control voltage being applied across said first and second control voltage input terminals.

2. A gain-controlled amplifier according to claim 1, wherein
   conductivities of said first bipolar transistor pair and second bipolar transistor pair are opposite to each other, and
   the collectors of said first and fourth transistors are joined together to form a first joined collector and the collectors of said second and third transistors are joined together to form a second joined collector, the output of said gain-controlled amplifier being derived from either one of said first and second joined collectors and being applied to said output signal terminal of said gain-controlled amplifier.

3. A gain-controlled amplifier according to claim 2, wherein
   said input signal amplifying means generates the output having a voltage $v_1$ applied to said first and second joined emitters through first resistor means having a resistance value $R_1$ and second resistor means having a resistance value $R_1$, respectively,
   said first generating means comprises a first operational amplifier having an input terminal coupled to said first joined collector, a feedback resistor whose value is $R_2'$, and an output terminal coupled to said addition means from which said first signal having a voltage $v_0'$ is derived,
   said second generating means comprises a second operational amplifier having an input terminal coupled to said second joined collector, a feedback resistor whose value is $R_2$, and an output terminal coupled to said addition means from which said second signal having a voltage $v_0$ is derived, and
   said addition means adds said voltage $v_0$ to said voltage $v_0'$ to obtain a feedback signal having a voltage $v_2$, and wherein $$v_2 = -(R_2/R_1)\cdot v_1$$

4. A gain-controlled amplifier according to claim 3, wherein
   said input signal amplifying means is comprised of a third operational amplifier, to an inveting input terminal of which the input signal from said input signal terminal is applied, and to a non-inverting input terminal of which the output of said addition means is negative-fed back.

5. A gain-controlled amplifier according to claim 3, wherein
   said input signal amplifying means is comprised of a fourth operational amplifier whose non-invering input terminal is grounded, the input signal from said input signal terminal is applied to an inverting input terminal of said fourth operational amplifier, and the output of said addition means is negative-fed back through a fifth operational amplifier to the inverting input terminal of said fourth operational amplifier.

6. A gain-controlled amplifier according to claim 3, wherein
   said input signal amplifying means is comprised of a sixth operational amplifier whose non-inverting input terminal is supplied with the input signal from said input signal terminal, and the output of said addition means is negative-fed back through a seventh operational amplifier to an inverting input terminal of said sixth operational amplifier.

7. A gain-controlled amplifier according to claim 1, wherein
   conductivities of said first bipolar transistor pair and second bipolar transistor pair are same to each other, and
   said first and second joined emitters are driven by the output of said input signal amplifying means in opposite phases to each other.

8. A gain-controlled amplifier according to claim 7, wherein
   said input amplifying means comprises means for generating two output signals of opposite phases to each other as the output signal of said input amplifying means,
   said two output signals from said input signal amplifying means being applied to said first and second joined emitters, respectively.

9. A gain-controlled amplifier according to claim 8, wherein
   said first generating means comprises a seventh operational amplifier one input terminal of which is coupled to the collector of said first transistor, the other input terminal of which is coupled to the collector of said fourth transistor, and an output terminal of which is coupled to said addition means, said seventh operational amplifier operating a subtraction between the collector currents of said first and fourth transistors, said second generating means comprises an eighth operational emplifier one input terminal of which is coupled to the collector of said second transistor, the other input terminal of which is coupled to the collector of said third transistor, and an output terminal of which is coupled to said addition means, said eighth operational amplifier operating a subtraction between the collector currents of said second and third transistors, and one of the output terminals of said seventh and eighth operational amplifiers is coupled to said output terminal of said gain-controlled amplifier.

10. A gain-controlled amplifier according to any one of claims 1 through 9, further comprising:

a fifth transistor having a conductivity opposite to that of said first transistor connected in series therewith, the emitters of said first and fifth transistors being connected together, and a base and a collector of fifth transistor being coupled together;

a sixth transistor having a conductivity opposite to that of said second transistor connected in series therewith, the emitters of said second and sixth transistors being connected together, and a base and a collector of said sixth transistor being coupled together, and said collectors of said fifth and sixth transistors being joined together to serve as said first joined emitter;

a seventh transistor having a conductivity opposite to that of said third transistor connected in series therewith, the emitters of said third and seventh transistors being connected together, and a base and a collector of said seventh transistor being coupled together; and an eighth transistor having a conductivity opposite to that of said fourth transistor connected in series therewith, the emitters of said fourth and eighth transistors being connected together, and a base and a collector of said eighth transistor being coupled together, and said collectors of said seventh and eighth transistors being joined together to serve as said second joined emitter.

11. A gain-controlled amplifier according to any one of claims 1 through 9, wherein said control voltage is applied symmetrically with respect to ground to both joined bases of said first and second bipolar transistor pairs.

* * * * *